(12) United States Patent
Jantzi et al.

(10) Patent No.: US 10,305,532 B1
(45) Date of Patent: May 28, 2019

(54) SYSTEMS AND METHODS TO DYNAMICALLY CHANGE REACTANCE TO SUPPORT MULTIPLE RF FREQUENCIES

(71) Applicant: BlackBerry Limited, Waterloo (CA)

(72) Inventors: Jason Wayne Jantzi, St. Clements (CA); Mahendra Fuleshwar Prasad, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 15/923,750

(22) Filed: Mar. 16, 2018

(51) Int. Cl.
H04B 1/18 (2006.01)
H04B 1/40 (2015.01)
H04B 1/00 (2006.01)

(52) U.S. Cl.
CPC .............. *H04B 1/40* (2013.01); *H04B 1/005* (2013.01)

(58) Field of Classification Search
CPC .................................. H04B 1/40; H04B 1/005
See application file for complete search history.

(56) References Cited

U.S. PATENT DOCUMENTS

| | | | | |
|---|---|---|---|---|
| 2015/0147980 A1* | 5/2015 | Larsen | ................... | H01Q 5/314 455/77 |
| 2018/0027560 A1* | 1/2018 | Greene | ..................... | H04L 5/14 370/281 |

OTHER PUBLICATIONS

"Nordic Semiconductor Evaluation Kit for nRF905 Sub 1-GHz", https://www.nordicsemi.com/eng/Products/Sub-1-GHz-RF/nRF905-Evaluation-Kit, 2018, 1 page.
"Silicon Labs Board Schematic", 2.4 GHz / 434 MHz 10 dBm, VDCDC to PAVDD, 2017, 4 pages.
"Silicon Labs Board Schematic", 2.4 GHz / 915 MHz 19 dBm, VMCU to PAVDD, 2017, 4 pages.
"STMicroelectronics BALF-SPI2-01D3", 2017, 12 pages.
"Texas Instruments Microcontroller schematic, CC1350 RF", 2016, 5 pages.
Cervin, et al., "U.S. Appl. No. 15/791,177, filed Oct. 23, 2017".

* cited by examiner

*Primary Examiner* — Tuan H Nguyen
(74) *Attorney, Agent, or Firm* — Guntin & Gust, PLC; Matthew Tropper

(57) ABSTRACT

A method that incorporates teachings of the subject disclosure may include, for example, a method comprising receiving from a transceiver that is implemented as an integrated circuit (IC) chip, by a variable reactive element, a signal, wherein the signal is in a frequency band that comprises a first sub-frequency band and a second sub-frequency band, controlling, by a controller, the variable reactive element, such that the variable reactive element is placed into one of a group of states, wherein the group of states comprises a first state having a first reactance and a second state having a second reactance, and wherein the first reactance is different from the second reactance. Other embodiments are disclosed.

20 Claims, 16 Drawing Sheets

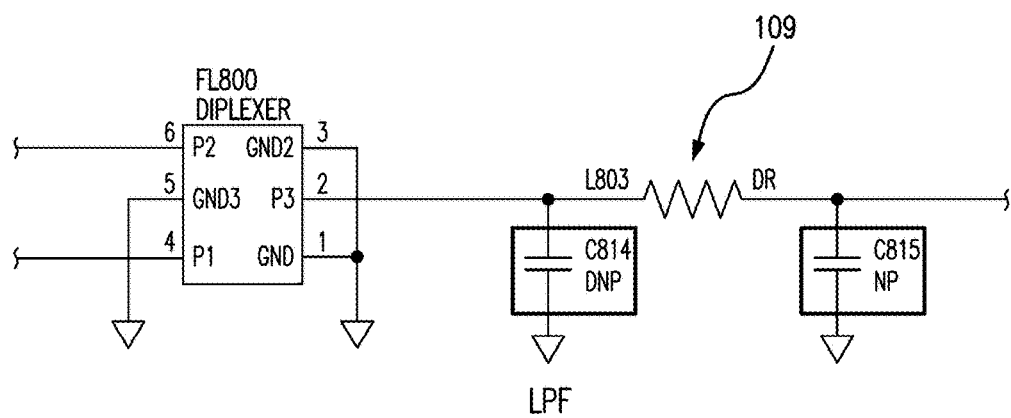
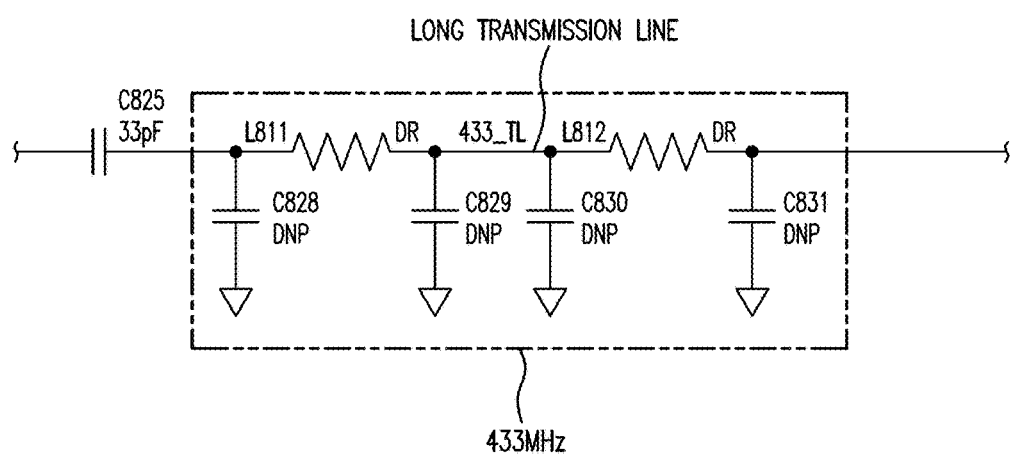
FIG. 1C

Receiving from a transceiver that is implemented as an integrated circuit (IC) chip, by a variable reactive element, a signal, wherein the signal is in a frequency band that comprises a first sub-frequency band and a second sub-frequency band, and wherein the first sub-frequency band is below the second sub-frequency band          303

Controlling, by a controller in operative communication with the variable reactive element, the variable reactive element, wherein the controller controls the variable reactive element by placing the variable reactive element into one of a group of states, wherein the group of states comprises a first state having a first reactance and a second state having a second reactance, and wherein the first reactance is different from the second reactance          305

Low pass filtering, by a low pass filter in operative communication with the variable reactive element, an output from the variable reactive element, wherein the low pass filter filters a first portion of the signal in a first case that the variable reactive element is placed into the first state, wherein the low pass filter filters a second portion of the signal in a second case that the variable reactive element is placed into the second state, wherein in the first case the low pass filter outputs a first part of the first portion of the signal that is below a first threshold, wherein in the second case the low pass filter outputs a second part of the second portion of the signal that is below a second threshold, and wherein the first threshold is below the second threshold          307

Transmitting a transmitted signal in accordance with one of the first part of the first portion of the signal that is below the first threshold or the second part of the second portion of the signal that is below the second threshold          309

SYSTEMS AND METHODS TO DYNAMICALLY CHANGE REACTANCE TO SUPPORT MULTIPLE RF FREQUENCIES

FIELD OF THE DISCLOSURE

The subject disclosure relates to systems and methods to dynamically change reactance (e.g., capacitance and/or inductance) to support multiple RF frequencies (e.g., multiple short-range RF frequencies).

BACKGROUND

LC balun topologies (and off the shelf baluns) are typically narrowband in nature. Various conventional implementations (such as short-range ISM sub-GHZ implementations) use different discrete baluns (with different impedances) for use with different frequencies.

BRIEF DESCRIPTION OF THE DRAWINGS

Reference will now be made to the accompanying drawings, which are not necessarily drawn to scale, and wherein:

FIG. 3 depicts an example method according to an embodiment;

DETAILED DESCRIPTION

Figure 1:
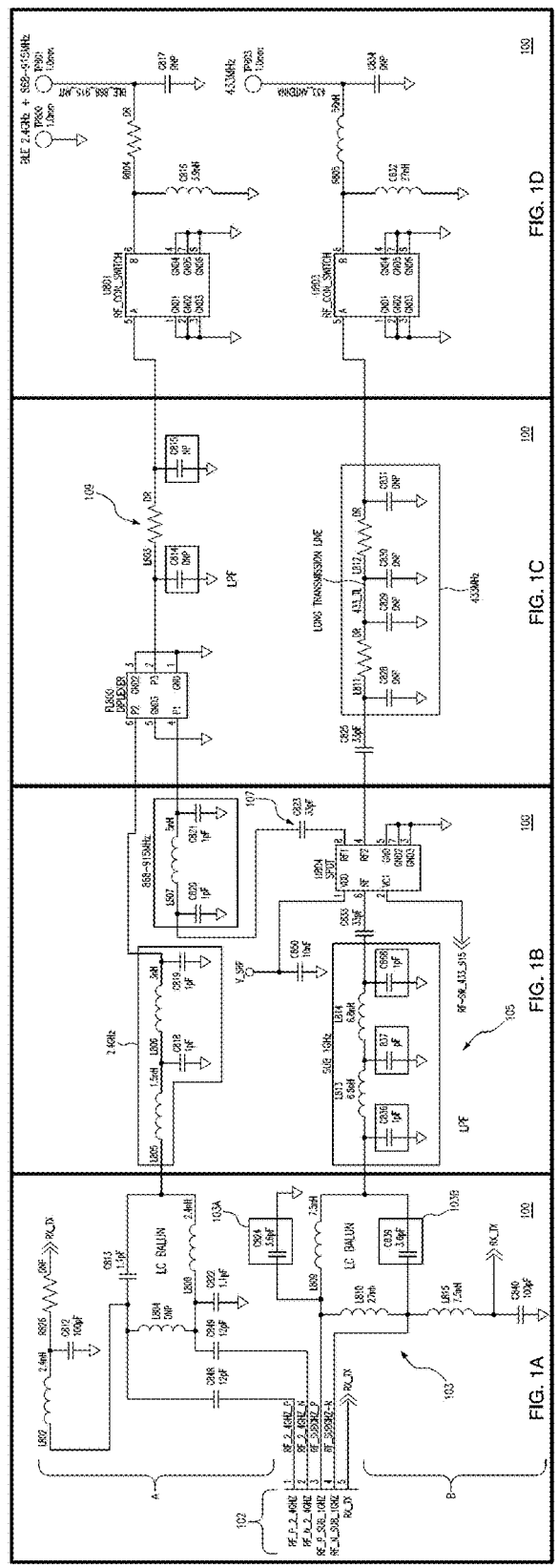
FIG. 1 depicts a schematic diagram of an apparatus according to an embodiment (FIGS. 1A, 1B, 1C and 1D depict larger views of the corresponding portions marked in FIG. 1)
Figure 1A:
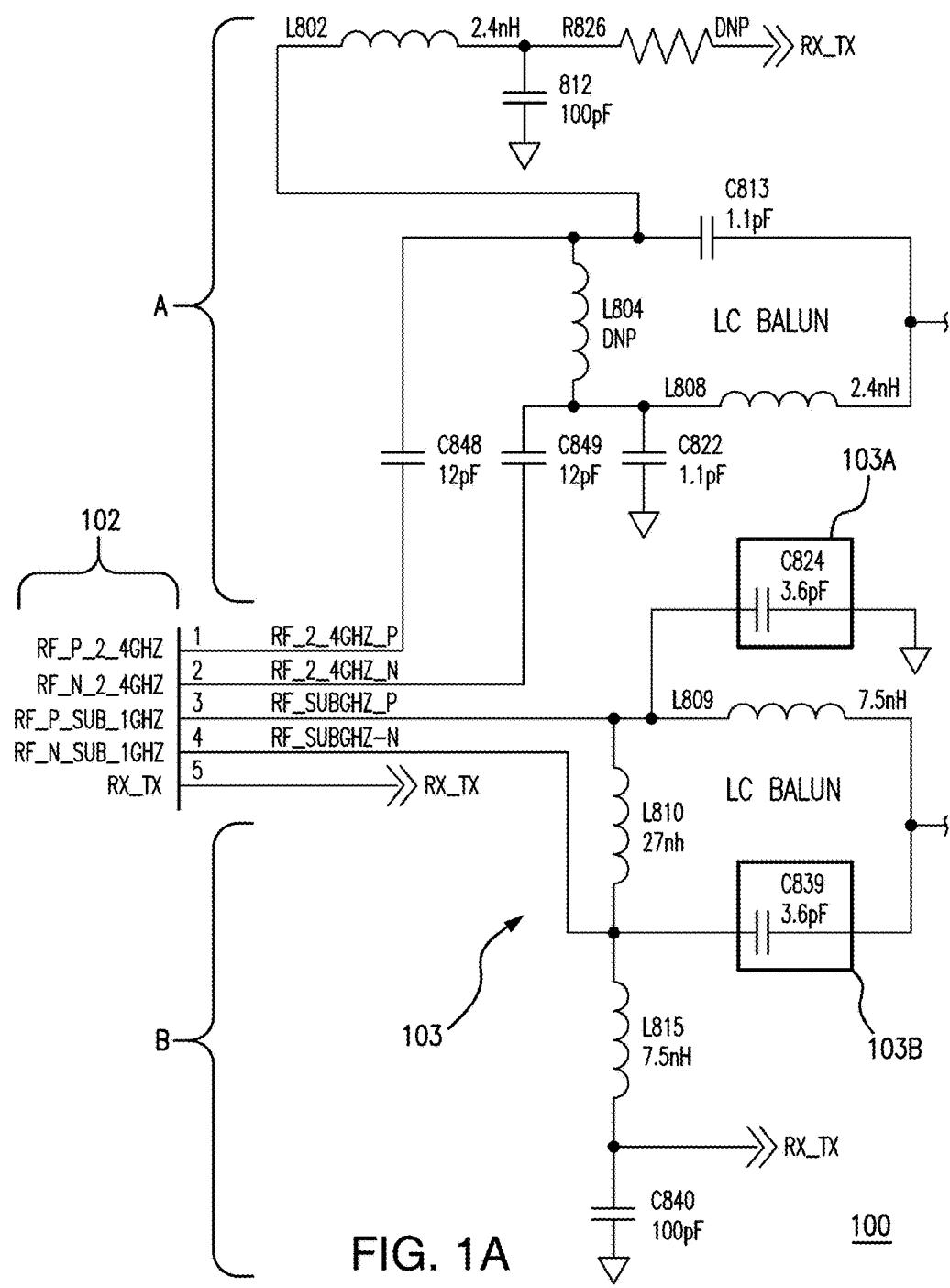
Figure 1B:
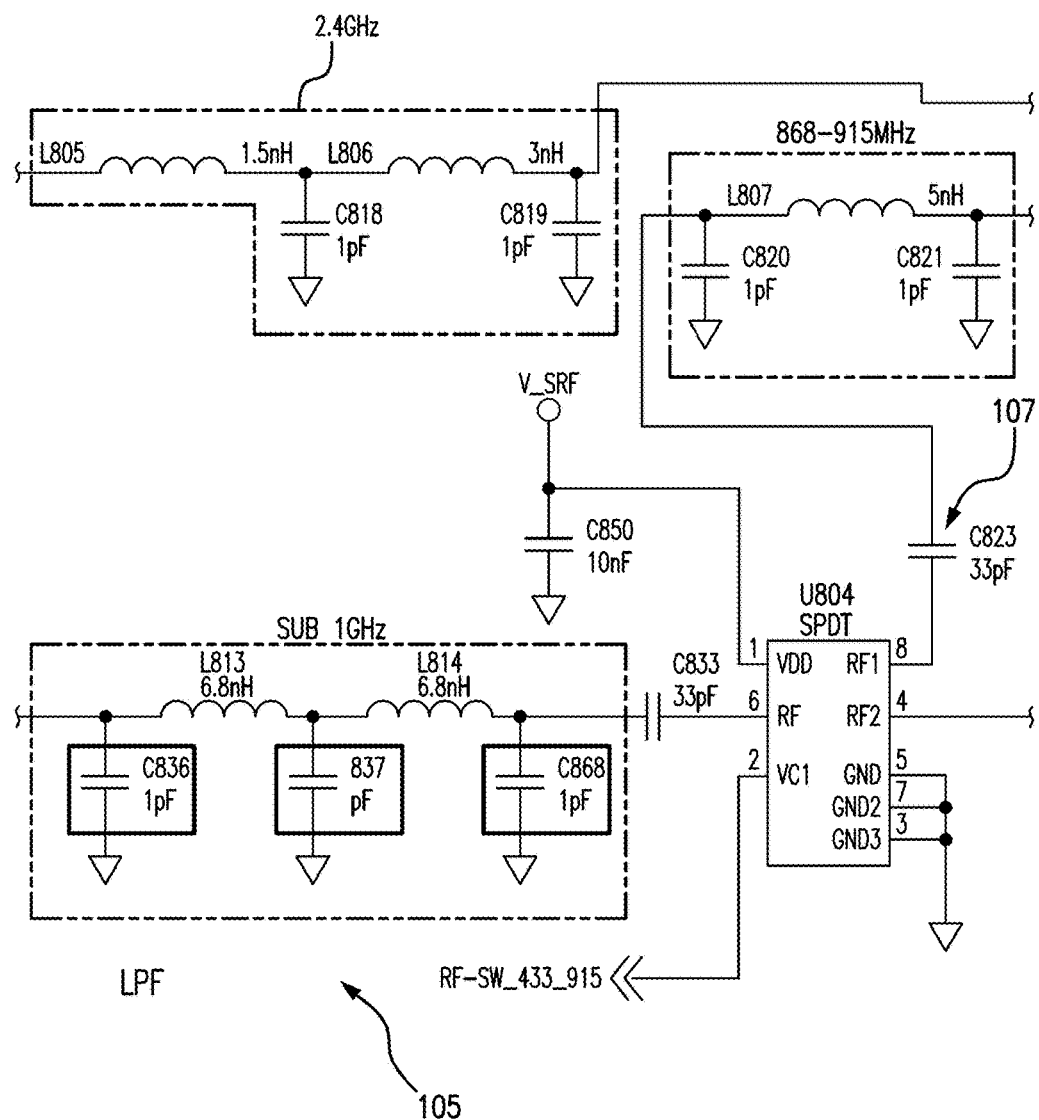
Figure 1D:
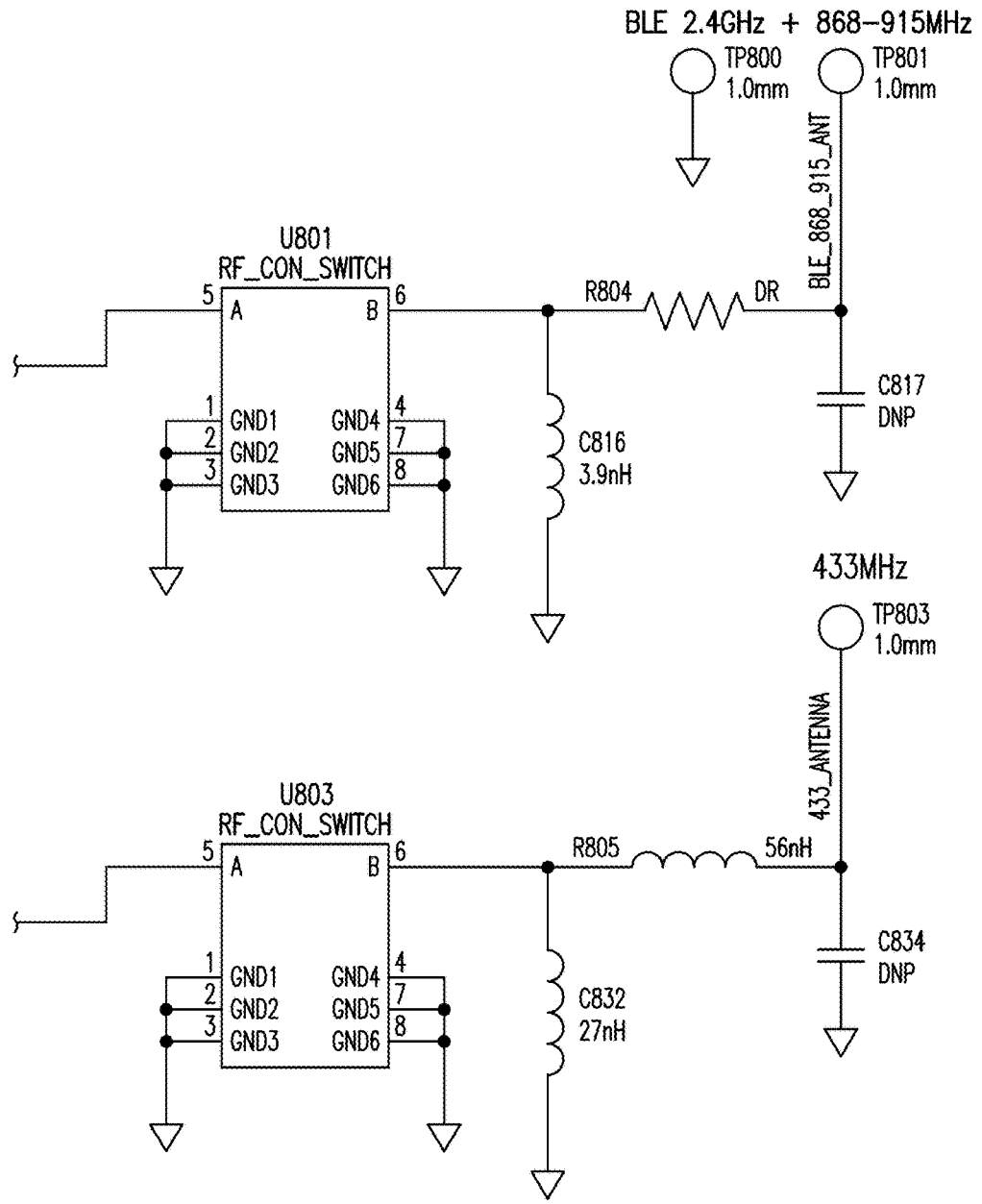

The subject disclosure describes, among other things, illustrative embodiments of systems and methods to dynamically change impedance (e.g., via a change in reactance) to support multiple RF frequencies (e.g., multiple short-range RF frequencies). The term dynamically can, in this context, comprise real-time and/or near real-time. In various examples, systems and methods are provided to dynamically change impedance (e.g., via a change in reactance) to support multiple industrial, scientific and medical (ISM) band short-range RF frequencies of both 433 MHz and 868/916 MHz simultaneously (or substantially simultaneously). Various embodiments can be implemented in the context of asset tracking, tracking of trucks (or other vehicles), tracking of shipping containers (e.g., freight containers or other such mechanisms), cargo (or other load) detection, and/or door (or other such mechanism) open/closed sensors. Other embodiments are described by the subject disclosure.

As described herein, various embodiments provide for the use of short-range ISM radio frequency (RF) in both 433 MHz and 868/916 MHz bands simultaneously (or substantially simultaneously) using a one chip RF hardware design. As described herein, various embodiments provide for support of 868 MHz for use in the European Union (EU) and 916 MHz for use in North America (NA) in combination with 433 MHz at the same time (or substantially the same time). In one specific example, a 433 MHz frequency can be used in connection with transmitting and/or receiving data to or from a tire pressure monitoring system (TPMS). In another specific example, the 868 MHz frequency be used in connection with transmitting and/or receiving data in a dedicated frequency for cargo (or other load) detection and/or door open/closed sensors. In another specific example, the 916 MHz frequency be used in connection with transmitting and/or receiving data in a dedicated frequency for cargo (or other load) detection and/or for door open/closed sensors.

As described herein, one or more tunable components (e.g., barium strontium titanate (BST) capacitors and/or or switched capacitor/inductor (C/L) banks) can be placed in the short-range RF circuit to tune to the appropriate band of operation. In various examples, the single ended to differential-SE balun, and harmonic low pass filter (LPF), can all be tuned (e.g., depending on the frequency and/or power requirements).

One embodiment of the subject disclosure includes a device, comprising: a junction that facilitates receiving a signal from a transceiver, wherein the transceiver is implemented as an integrated circuit (IC) chip, wherein the signal is in a frequency band, wherein the frequency band comprises a first sub-frequency band and a second sub-frequency band, and wherein the first sub-frequency band is below the second sub-frequency band; a variable reactive element coupled to the junction, wherein the variable reactive element receives from the junction a first portion of the signal and a second portion of the signal, wherein the first portion of the signal is in the first sub-frequency band and the second portion of the signal is in the second sub-frequency band; a controller coupled to the variable reactive element, wherein the controller facilitates control of the variable reactive element for placing the variable reactive element into one of a group of states, wherein the group of states comprises a first state having a first reactance and a second state having a second reactance, and wherein the first reactance is different from the second reactance; and a low pass filter coupled to the variable reactive element, wherein the low pass filter receives from the variable reactive element the first portion of the signal in a first case that the variable reactive element is placed into the first state, wherein the low pass filter receives from the variable reactive element the second portion of the signal in a second case that the variable reactive element is placed into the second state, wherein in the first case the low pass filter outputs a first part of the first portion of the signal that is below a first frequency cutoff, wherein in the second case the low pass filter outputs a second part of the second portion of the signal that is below a second frequency cutoff, and wherein the first frequency cutoff is below the second frequency cutoff.

Another embodiment of the subject disclosure includes a circuit, comprising: a connection that facilitates receiving a signal from a radio that is implemented as an integrated circuit (IC) chip, wherein the signal is in a frequency band, wherein the frequency band comprises a first sub-frequency band and a second sub-frequency band, and wherein the first sub-frequency band is below the second sub-frequency band; a variable reactive element, wherein the variable reactive element receives the signal from the connection, wherein a first part of the signal is in the first sub-frequency band and a second part of the signal is in the second sub-frequency band; a controller, wherein the controller is in operative communication with the variable reactive element, wherein the controller facilitates control of the variable reactive element for placing the variable reactive element into one of a group of states, wherein the group of states comprises a first state having a first reactance value and a second state having a second reactance value, and wherein the first reactance value is different from the second reactance value; and a low pass filter, wherein the low pass filter is in operative communication with the variable reactive element, wherein the low pass filter receives from the variable reactive element the first part of the signal in a first case that the reactance of the variable reactive element is set to the first reactance value, wherein the low pass filter receives from the variable reactive element the second part of the signal in a second case that the reactance of the variable reactive element is set to the second reactance value, wherein in the first case the low pass filter outputs a first portion of the signal that is below a first threshold, wherein in the second case the low pass filter outputs a second portion of the signal that is below a second threshold, and wherein the first threshold is below the second threshold.

Another embodiment of the subject disclosure includes a method, comprising: receiving from a transceiver that is implemented as an integrated circuit (IC) chip, by a variable reactive element, a signal, wherein the signal is in a frequency band that comprises a first sub-frequency band and a second sub-frequency band, and wherein the first sub-frequency band is below the second sub-frequency band; controlling, by a controller in operative communication with the variable reactive element, the variable reactive element, wherein the controller controls the variable reactive element by placing the variable reactive element into one of a group of states, wherein the group of states comprises a first state having a first reactance and a second state having a second reactance, and wherein the first reactance is different from the second reactance; and low pass filtering, by a low pass filter in operative communication with the variable reactive element, an output from the variable reactive element, wherein the low pass filter filters a first portion of the signal in a first case that the variable reactive element is placed into the first state, wherein the low pass filter filters a second portion of the signal in a second case that the variable reactive element is placed into the second state, wherein in the first case the low pass filter outputs a first part of the first portion of the signal that is below a first threshold, wherein in the second case the low pass filter outputs a second part of the second portion of the signal that is below a second threshold, and wherein the first threshold is below the second threshold.

Referring now to FIG. 1 (and corresponding FIGS. 1A-1D), a schematic diagram of system 100 is shown. System 100 includes transceiver 102 (in one specific example, transceiver 102 is implemented as a single integrated circuit (IC) chip). Transceiver 102 has a number of input/output pins. The 2.4 GHZ P and N are differential input and output for the 2.4 GHZ band. The subGHZ P and N are differential input and output for the sub 1 GHZ bands.

Rx_Tx is an output bias voltage for both Tx and Rx. Each of the above-mentioned pins is connected to a respective one of lines 1-5 shown in FIG. 1 (and corresponding FIGS. 1A-1D). Each of lines 1-2 is associated with the portion of the circuit labelled generally as "A" and each of lines 3-4 is associated with the portion of the circuit labelled generally as "B". Line 5 is an Rx_Tx line.

Still referring to FIG. 1 (and corresponding FIGS. 1A-1D), lines 3-4 connect to LC Balun 103. LC Balun 103 is configured to provide a controllable, variable reactance. Such a controllable, variable reactance can be provided via any mechanism described herein (e.g., one or both of capacitors 103A, 103B can comprise a barium strontium titanate (BST) tunable capacitor and/or can comprise a switched bank of capacitors/inductors). In one specific example, the Sub-1 Ghz signal received from transceiver 102 can include a first portion in a first sub-frequency band (comprising 433 MHz) and a second portion in a second sub-frequency band (comprising a 868-915 MHz range). In another specific example, a controller (not shown) can be communicatively coupled to the LC Balun 103, wherein the controller facilitates control of the LC Balun 103 for placing the LC Balun 103 into one of a group of states, wherein the group of states comprises a first state having a first reactance and a second state having a second reactance, and wherein the first reactance is different from the second reactance. Of note, while LC Balun 103 is shown as including two capacitors, any desired number of capacitors (and/or inductors) can be utilized). In another example, the controller can be implemented into the circuit of FIG. 1 (and corresponding FIGS. 1A-1D) (e.g., as a host processor). In another example, the tuning of the capacitor can be based upon voltage level (e.g., a voltage level from a high-voltage stack controlled by a host processor). In another example, the controller can be of the type shown in FIG. 2 (and corresponding FIGS. 2A-2B) as element 202.

Still referring to FIG. 1 (and corresponding FIGS. 1A-1D), LC Balun 103 connects to low pass filter (LPF) 105. LPF 105 is configured to provide a controllable, variable reactance. Such a controllable, variable reactance can be provided via any mechanism described herein (e.g., one, two, or three of the capacitors of LPF 105 can comprise a barium strontium titanate (BST) tunable capacitor and/or can comprise a switched bank of capacitors/inductors). LPF 105 receives from the LC Balun 103 the first portion of the signal in a first case that the the LC Balun 103 is placed into the first state and the LPF 105 receives from the LC Balun 103 the second portion of the signal in a second case that the LC Balun 103 is placed into the second state. In the first case, the LPF 105 outputs a first part of the first portion of the signal that is below a first frequency cutoff. In the second case, the LPF 105 outputs a second part of the second portion of the signal that is below a second frequency cutoff (wherein the first frequency cutoff is below the second frequency cutoff). In one specific example, LPF 105 can be configured to meet certain government requirements/regulations (e.g., United States FCC requirements/regulations, European Union requirements/regulations, ARIB STD-T108 requirements/regulations for Japan, AS/NZS 4268 requirements/regulations for Australia/New Zealand, NCC/LP0002 requirements/regulations for Taiwan). Of note, while LPF 105 is shown as including three capacitors, any desired number of capacitors (and/or inductors) can be utilized.

Still referring to FIG. 1 (and corresponding FIGS. 1A-1D), LPF 105 is in operative communication with the remainder of portion "B" of the circuit to facilitate transmission of, in this example, the 433 MHz signal to the terminating end at the right-hand side (see the 433 MHz interface). In addition, portion "B" of the circuit connects to portion "A" of the circuit via capacitor 107. It is through this connecting capacitor 107 that a signal (e.g., 868-915 MHz) is transmitted to the terminating end on the right-hand side of portion "A" (see the Bluetooth Low Energy (BLE) 2.4 GHz+868-915 MHz interface). As seen, low pass filter (LPF) 109 can be utilized and can be configured to meet certain government requirements/regulations (e.g., United States FCC requirements/regulations, European Union requirements/regulations, ARIB STD-T108 requirements/regulations for Japan, AS/NZS 4268 requirements/regulations for Australia/New Zealand, NCC/LP0002 requirements/regulations for Taiwan). LPF 109 is configured to provide a controllable, variable reactance. Such a controllable, variable reactance can be provided via any mechanism described herein (e.g., one or both of the capacitors of LPF 109 can comprise a barium strontium titanate (BST) tunable capacitor and/or can comprise a switched bank of capacitors/inductors). Of note, while LPF 109 is shown as including two capacitors, any desired number of capacitors (and/or inductors) can be utilized).

Figure 2:
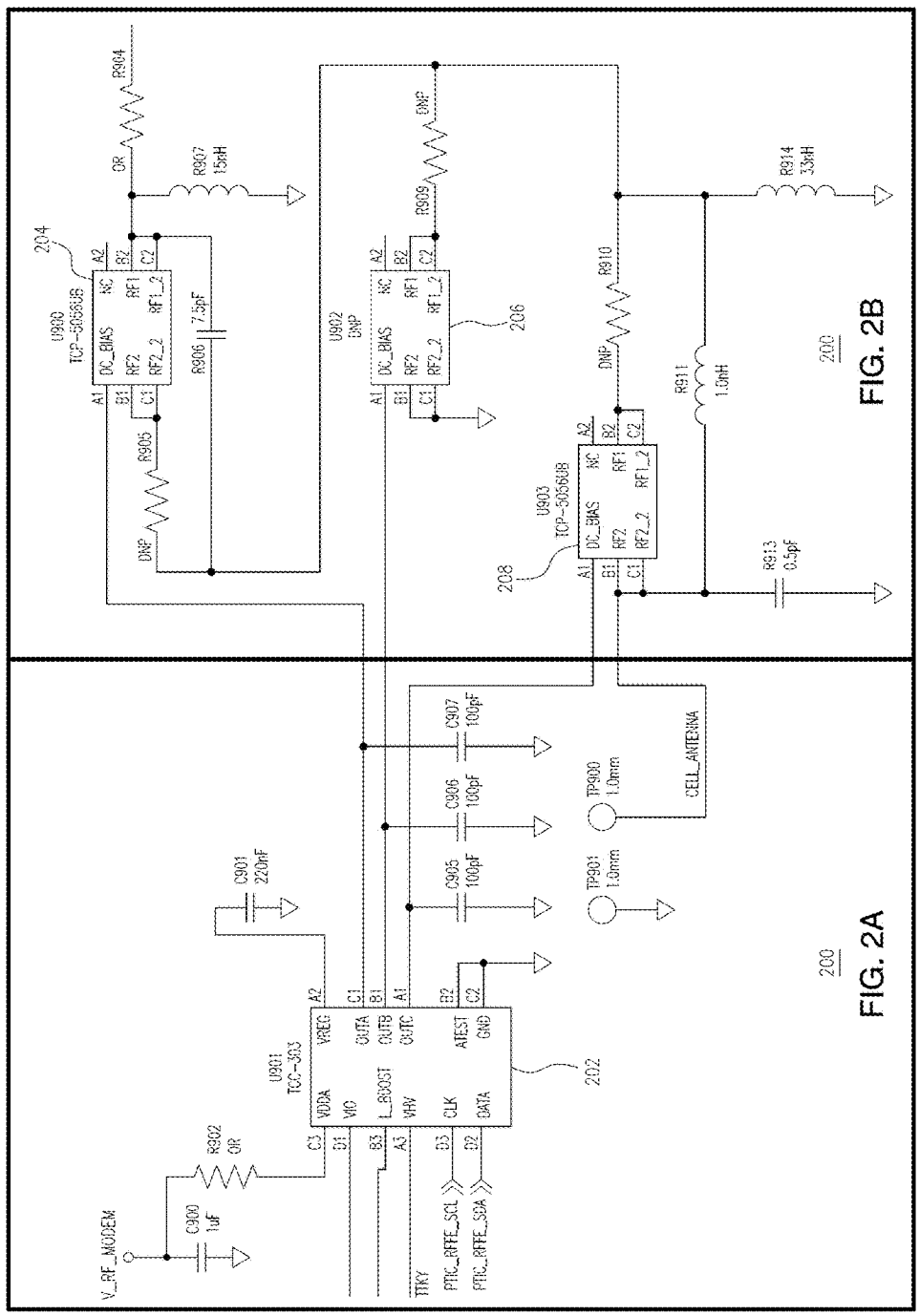
FIG. 2 depicts a schematic diagram of an apparatus according to an embodiment (FIGS. 2A and 2B depict larger views of the corresponding portions marked in FIG. 2)
Figure 2A:
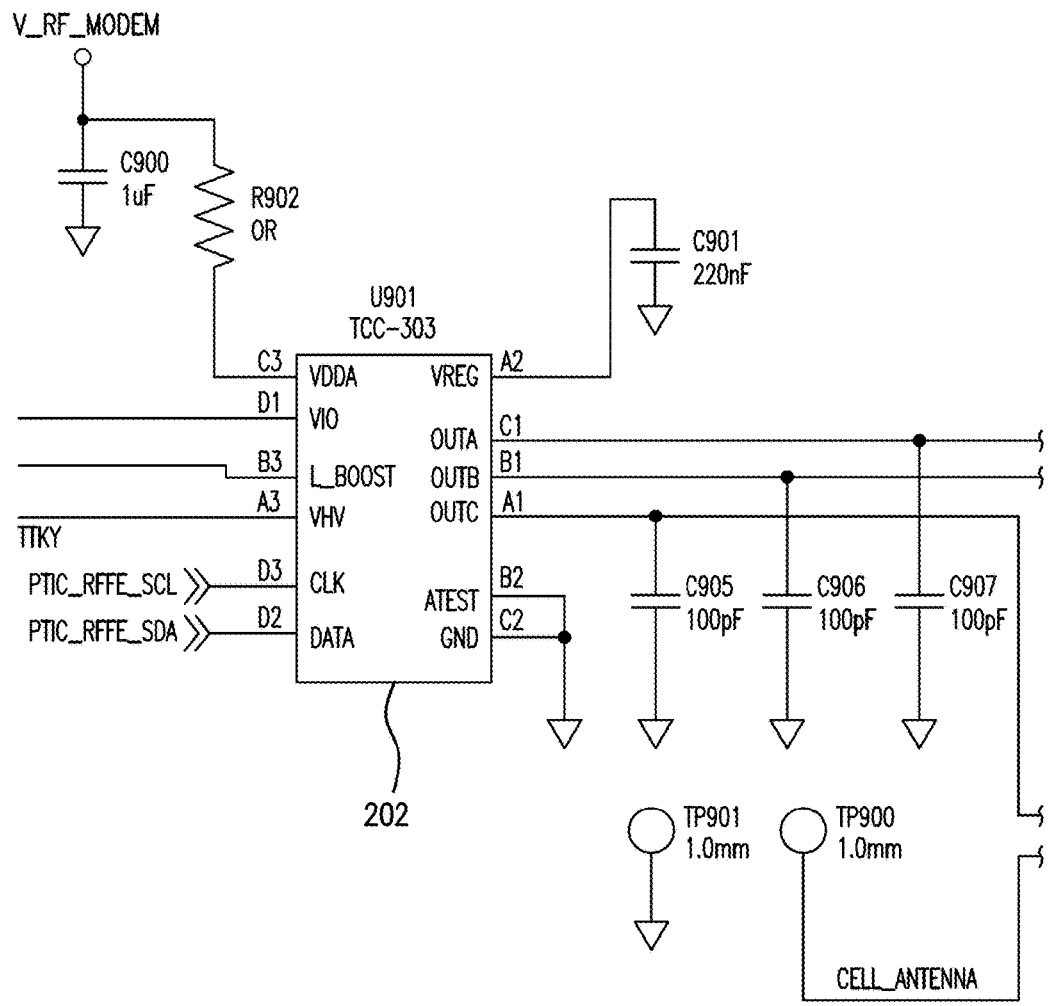
Figure 2B:
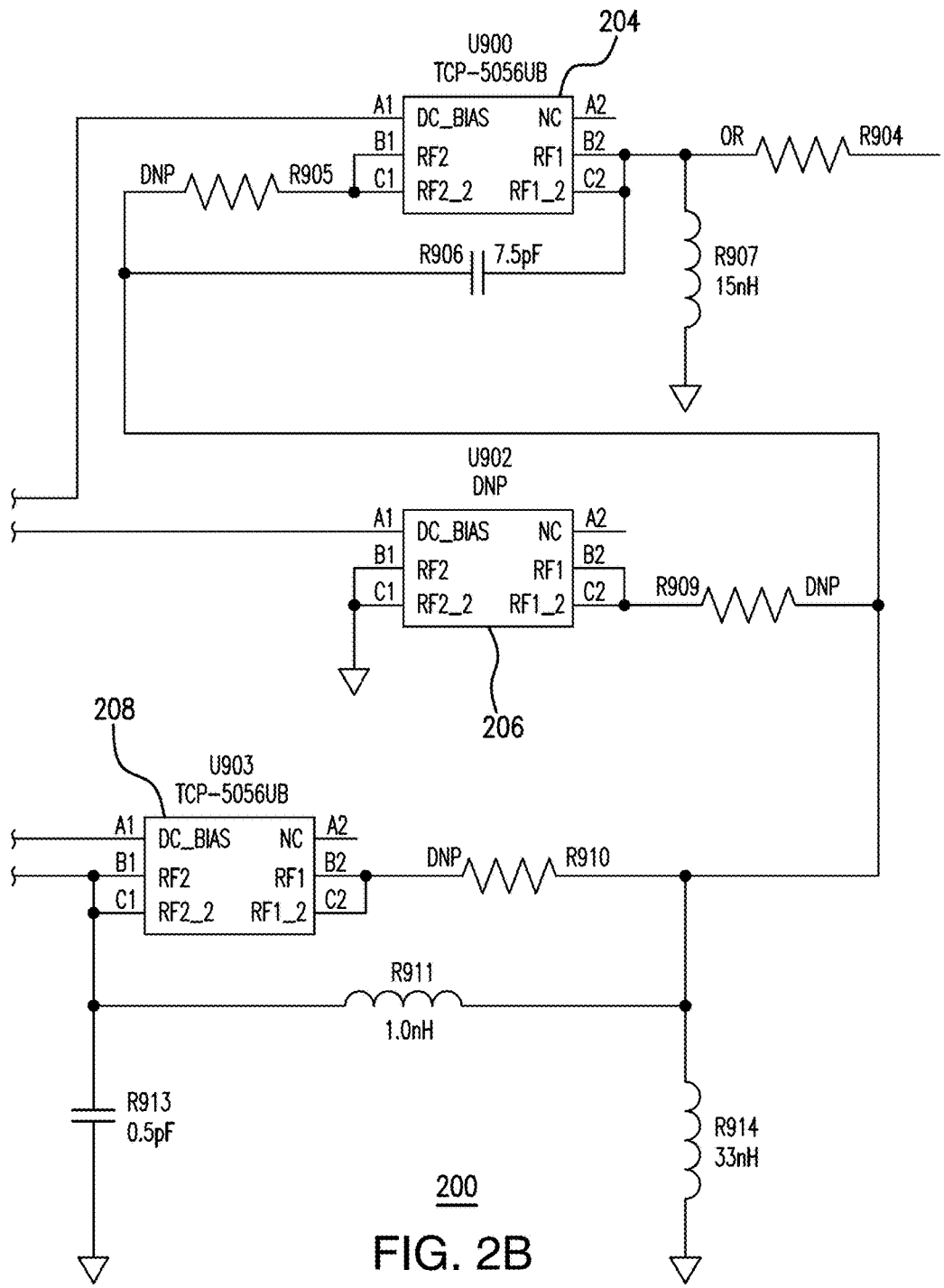

Referring now to FIG. 2 (and corresponding FIGS. 2A-2B), a schematic diagram of a tunable PARATEK capacitor system 200 is shown. As seen in this FIG. 2 (and corresponding FIGS. 2A-2B), each of OUTA, OUTB, OUTC from controller 202 provides high voltages to a respective one of BST capacitors 204, 206, 208. In this example, each applied voltage is changed via an algorithm in the controller 202. Each changing voltage changes the respective capacitor value as needed (e.g., to support a particular frequency or frequency band). In this example, each of the capacitors 204, 206, 208 has sufficient linearity to work effectively in the context of the particular implementation.

Referring now to FIG. 3, various steps of a method 300 according to an embodiment are shown. As seen in this FIG. 3, step 303 comprises receiving from a transceiver that is implemented as an integrated circuit (IC) chip, by a variable reactive element, a signal, wherein the signal is in a frequency band that comprises a first sub-frequency band and a second sub-frequency band, and wherein the first sub-frequency band is below the second sub-frequency band. Next, step 305 comprises controlling, by a controller in operative communication with the variable reactive element, the variable reactive element, wherein the controller controls the variable reactive element by placing the variable reactive element into one of a group of states, wherein the group of states comprises a first state having a first reactance and a second state having a second reactance, and wherein the first reactance is different from the second reactance. Next, step 307 comprises low pass filtering, by a low pass filter in operative communication with the variable reactive element, an output from the variable reactive element, wherein the low pass filter filters a first portion of the signal in a first case that the variable reactive element is placed into the first state, wherein the low pass filter filters a second portion of the signal in a second case that the variable reactive element is placed into the second state, wherein in the first case the low pass filter outputs a first part of the first portion of the signal that is below a first threshold, wherein in the second case the low pass filter outputs a second part of the second portion of the signal that is below a second threshold, and wherein the first threshold is below the second threshold. Next, step 309 comprises transmitting a transmitted signal in accordance with one of the first part of the first portion of the signal that is below the first threshold or the second part of the second portion of the signal that is below the second threshold (in various examples, the transmitting comprises transmitting data related to one of a tire pressure sensor measurement, a door open/closed sensor measurement, a load detection measurement, or a combination thereof).

In another embodiment, any desired number of sub-frequency bands can be supported. In this embodiment, a step can comprise receiving from a transceiver that is implemented as an integrated circuit (IC) chip, by a variable reactive element, a signal, wherein the signal is in a frequency band that comprises X number of sub-frequency bands. In one example, X is an integer between 2 and 10 (inclusive) and each of the X number of sub-frequency bands is offset from the others. In this embodiment, another step can comprise controlling, by a controller in operative communication with the variable reactive element, the variable reactive element, wherein the controller controls the variable reactive element by placing the variable reactive element into one of a group of X number of states. In one example, each state of the group of X number of states has a respective reactance (wherein each reactance differs from the others). In this embodiment, another step can comprise low pass filtering, by a low pass filter in operative communication with the variable reactive element, an output from the variable reactive element. In one example, the low pass filter filters a first portion of the signal in a first case that the variable reactive element is placed into a first state, wherein the low pass filter filters a second portion of the signal in a second case that the variable reactive element is placed into a second state, etc. (that is, filtering a portion of the signal corresponding to one of the X number of states). In one example, in the first case the low pass filter outputs a first part of the first portion of the signal that is below a first threshold, in the second case the low pass filter outputs a second part of the second portion of the signal that is below a second threshold, etc. (that is, outputting, based on a respective threshold, a part of a respective portion of the signal corresponding to one of the X number of states). In one example, each threshold (other than the top threshold) is below an adjacent higher threshold. In this embodiment, another step can comprise transmitting a transmitted signal in accordance with a respective one of the parts of the signal that is below the respective threshold (in various examples, the transmitting comprises transmitting data related to one of a tire pressure sensor measurement, a door open/closed sensor measurement, a load detection measurement, or a combination thereof).

As described herein, one specific example is directed to 433 MHz and 868/916 MHz. In other examples, other frequency bands and/or standards (e.g., BLUETOOTH, ZIGBEE, WiSun, LORA, WLAN) can be supported.

In one or more embodiments, support can be provided by a given variable reactive element for any bands (or frequencies) having a channel separation that is large enough such that the channel separation cannot be supported by one non-variable balun and/or one non-variable LPF.

In one or more embodiments, support can be provided by the variable reactive element(s) for one or more ISM bands/frequencies. In a specific example, support can be provided for (a) 433.05 MHz-434.79 MHz and one or both of (b) 902 MHz-928 MHz and (c) 825 MHz-875 MHz.

Figure 4:
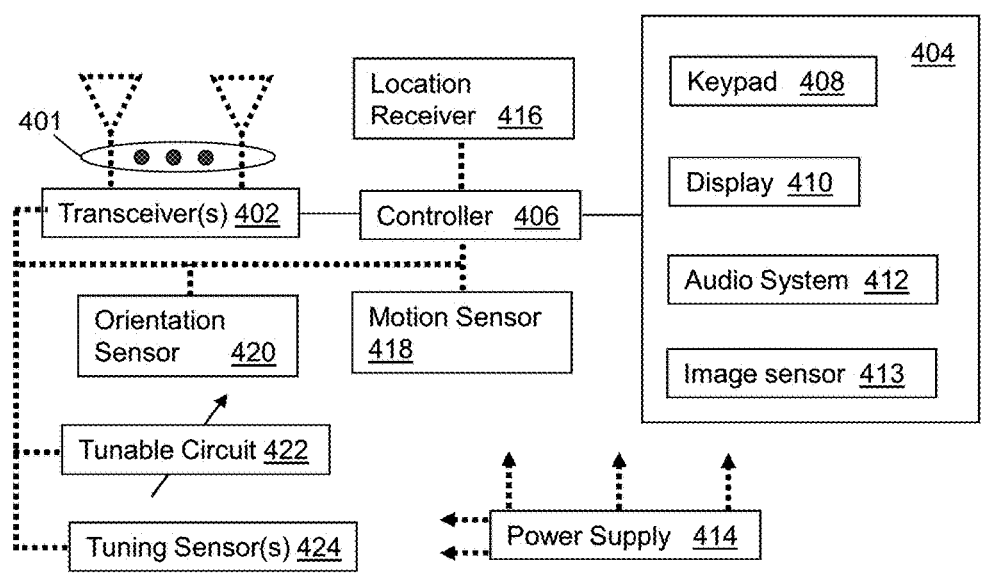
FIG. 4 depicts a communication device according to an embodiment.

FIG. 4 depicts an illustrative embodiment of a communication device 400. The communication device 400 can comprise one or more transceivers 402 coupled to one or more antennas 401, each transceiver having transmitter and receiver sections (herein transceiver 402 or transceivers 402), a tunable circuit 422, one or more tuning sensors 424, a user interface (UI) 404, a power supply 414, a location receiver 416, a motion sensor 418, an orientation sensor 420, and a controller 406 for managing operations thereof. The transceiver 402 can support short-range and/or long-range wireless access technologies such as ISM, Bluetooth, Zig-Bee, Wireless Fidelity (WiFi), Digital Enhance Cordless Telecommunications (DECT), or cellular communication technologies, just to mention a few.

The tunable circuit 422 can comprise variable reactive elements such as variable capacitors, variable inductors, or combinations thereof that are tunable with digital and/or analog bias signals. The tunable circuit 422 can represent a tunable matching network coupled to the antenna 401 to compensate for a change in impedance of the antenna 401, a compensation circuit to compensate for mutual coupling in a multi-antenna system, an amplifier tuning circuit to control operations of an amplifier of the transceiver 402, a filter tuning circuit to alter a pass band of a filter used by the transceiver 402, and so on.

Figure 5:
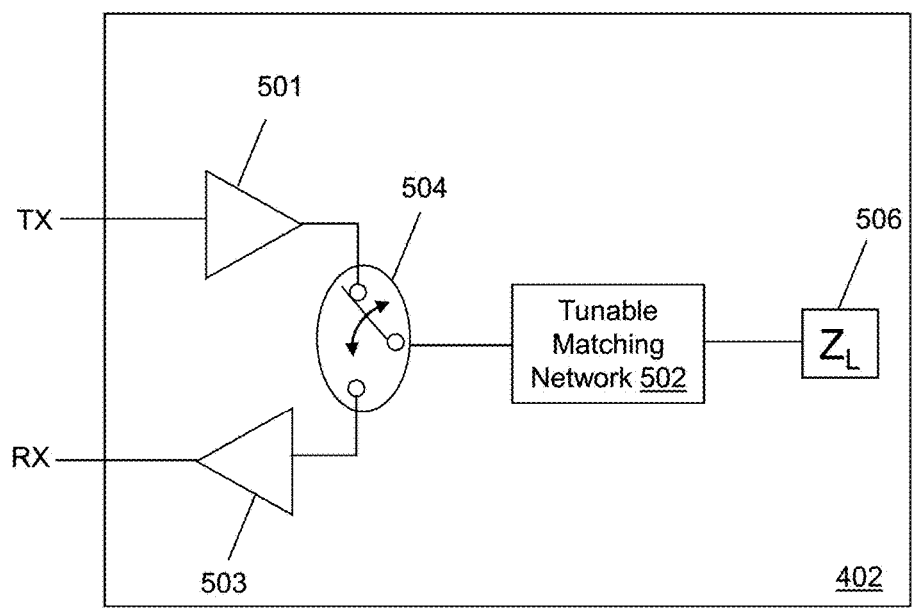
FIG. 5 depicts an illustrative embodiment of a portion of a transceiver of the communication device of FIG. 4.

The tuning sensors 424 can be placed at any stage of the transceiver 402 such as, for example, before or after a matching network 502, and/or at a power amplifier 501 as shown in FIG. 5. The tuning sensors 424 can utilize any suitable sensing technology such as directional couplers, voltage dividers, or other sensing technologies to measure signals at any stage of the transceiver 402. The digital samples of the measured signals can be provided to the controller 406 by way of analog-to-digital converters included in the tuning sensors 424. Data provided to the controller 406 by the tuning sensors 424 can be used to measure, for example, transmit power, transmitter efficiency, receiver sensitivity, power consumption of the communication device 400, frequency band selectivity by adjusting filter passbands, linearity and efficiency of power amplifiers, specific absorption rate (SAR) requirements, and so on. The controller 406 can be configured to execute one or more tuning algorithms to determine desired tuning states of the tunable circuit 422 based on the foregoing measurements.

The UI 404 can include a depressible or touch-sensitive keypad 408 with a navigation mechanism such as a roller ball, a joystick, a mouse, or a navigation disk for manipulating operations of the communication device 400. The keypad 408 can be an integral part of a housing assembly of the communication device 400 or an independent device operably coupled thereto by a tethered wireline interface (such as a USB cable) or a wireless interface supporting, for example, Bluetooth. The keypad 408 can represent a numeric keypad commonly used by phones, and/or a QWERTY keypad with alphanumeric keys. The UI 404 can further include a display 410 such as monochrome or color LCD (Liquid Crystal Display), OLED (Organic Light Emitting Diode) or other suitable display technology for conveying images to an end user of the communication device 400. In an embodiment where the display 410 is touch-sensitive, a portion or all of the keypad 408 can be presented by way of the display 410 with navigation features.

The display 410 can use touch screen technology to also serve as a user interface for detecting user input. As a touch screen display, the communication device 400 can be adapted to present a user interface with graphical user interface (GUI) elements that can be selected by a user with a touch of a finger. The touch screen display 410 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 410 can be an integral part of the housing assembly of the communication device 400 or an independent device communicatively coupled thereto by a tethered wireline interface (such as a cable) or a wireless interface.

The UI 404 can also include an audio system 412 that utilizes audio technology for conveying low volume audio (such as audio heard in proximity of a human ear) and high volume audio (such as speakerphone for hands free operation). The audio system 412 can further include a microphone for receiving audible signals of an end user. The audio system 412 can also be used for voice recognition applications. The UI 404 can further include an image sensor 413 such as a charged coupled device (CCD) camera for capturing still or moving images.

The power supply 414 can utilize common power management technologies such as replaceable and rechargeable batteries, supply regulation technologies, and/or charging system technologies for supplying energy to the components of the communication device 400 to facilitate long-range or short-range portable applications. Alternatively, or in combination, the charging system can utilize external power sources such as DC power supplied over a physical interface such as a USB port or other suitable tethering technologies.

The location receiver 416 can utilize location technology such as a global positioning system (GPS) receiver capable of assisted GPS for identifying a location of the communication device 400 based on signals generated by a constellation of GPS satellites, which can be used for facilitating location services such as navigation. The motion sensor 418 can utilize motion sensing technology such as an accelerometer, a gyroscope, or other suitable motion sensing technology to detect motion of the communication device 400 in three-dimensional space. The orientation sensor 420 can utilize orientation sensing technology such as a magnetometer to detect the orientation of the communication device 400 (north, south, west, and east, as well as combined orientations in degrees, minutes, or other suitable orientation metrics).

The communication device 400 can use the transceiver 402 to also determine a proximity to or distance to cellular, ISM, WiFi, Bluetooth, or other wireless access points by sensing techniques such as utilizing a received signal strength indicator (RSSI) and/or signal time of arrival (TOA) or time of flight (TOF) measurements.

The controller 406 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 400.

Other components not shown in FIG. 4 can be added to the communication device 400. For example, the communication device 400 can include a slot for inserting or removing an identity module such as a Subscriber Identity Module (SIM) card. SIM cards can be used for identifying and registering subscriber services, executing computer programs, storing subscriber data, and so forth.

FIG. 5 depicts an illustrative embodiment of a portion of the wireless transceiver 402 of the communication device 400 of FIG. 4. The transmit and receive portions of the transceiver 402 can include amplifiers 501, 503 coupled to a tunable matching network 502 that is in turn coupled to an impedance load 506. The impedance load 506 in the present illustration can be an antenna as shown in FIG. 4 (herein antenna 506). A transmit signal in the form of a radio frequency (RF) signal (TX) can be directed to the amplifier 501 which amplifies the signal and directs the amplified signal to the antenna 506 by way of the tunable matching network 502 when switch 504 is enabled for a transmission session. The receive portion of the transceiver 402 can utilize a pre-amplifier 503 which amplifies signals received from the antenna 506 by way of the tunable matching network 502 when switch 504 is enabled for a receive session. Other configurations of FIG. 5 are possible for other types of access technologies. These undisclosed configurations are applicable to the subject disclosure.

Figure 6:
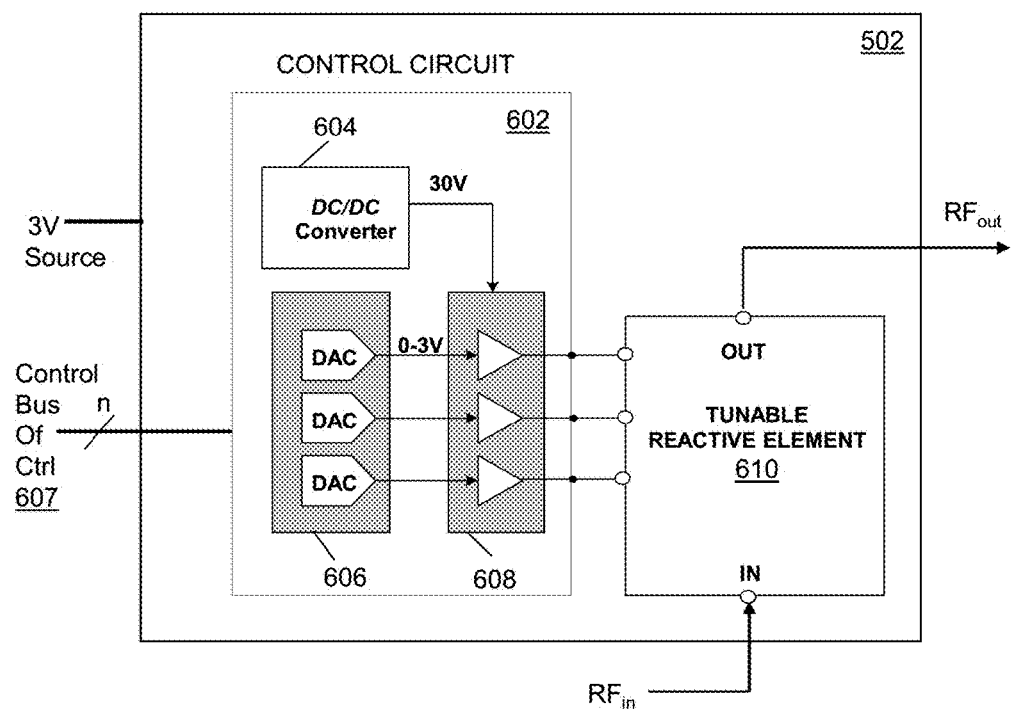
FIG. 6 depicts an illustrative embodiment of a tunable matching network of the transceiver of FIG. 5.
Figure 7:
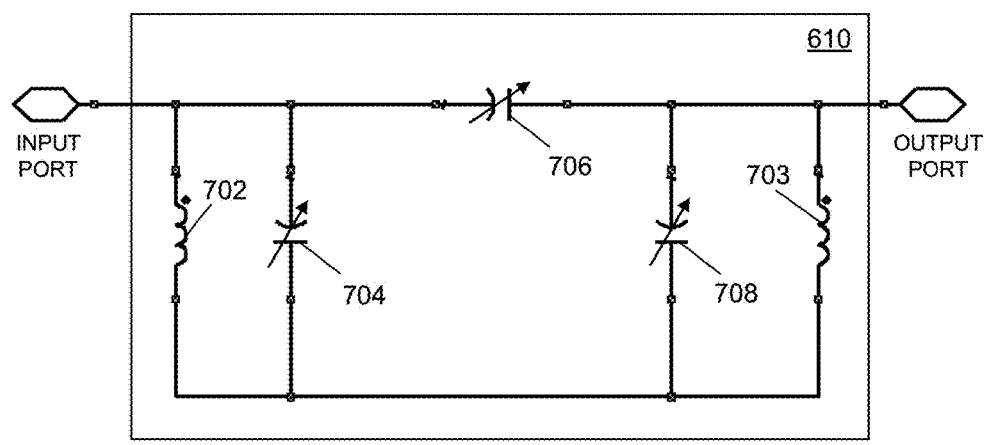
FIG. 7 depicts an illustrative embodiment of a tunable reactive element of the tunable matching network of FIG. 6.

FIGS. 6-7 depict illustrative embodiments of the tunable matching network 502 of the transceiver 402 of FIG. 4. In one embodiment, the tunable matching network 502 can comprise a control circuit 602 and a tunable reactive element 610. The control circuit 602 can comprise a DC-to-DC converter 604, one or more digital to analog converters (DACs) 606 and one or more corresponding buffers 608 to amplify the voltage generated by each DAC. The amplified signal can be fed to the tunable reactive element 610. In this illustration, the tunable reactive element 610 includes three tunable capacitors 704-708 and two inductors 702-703 with a fixed inductance (see FIG. 7). Circuit configurations such as "Tee", "Pi", and "L" configurations for a matching circuit are also suitable configurations that can be used in the subject disclosure. In one or more embodiments, switches can be utilized for changing the circuit configurations, such as enabling switching between "Tee", "Pi", and "L" configurations. In one or more embodiments, an inductor can be included in parallel with capacitor 706 (this could be used, for example, for a low pass architecture).

The tunable capacitors 704-708 can each utilize technology that enables tunability of the reactance of the component. One embodiment of the tunable capacitors 704-708 can utilize voltage or current tunable dielectric materials. The tunable dielectric materials can utilize, among other things, a composition of barium strontium titanate (BST). In another embodiment, the tunable reactive element 610 can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 610 of FIG. 6.

The DC-to-DC converter 604 can receive a DC signal such as 3 volts from the power supply 414 of the communication device 400 in FIG. 4. The DC-to-DC converter 604 can use technology to amplify a DC signal to a higher range (e.g., 30 volts) such as shown. The controller 406 can supply digital signals to each of the DACs 606 by way of a control bus 607 of "n" or more wires or traces to individually control the capacitance of tunable capacitors 704-708, thereby varying the collective reactive impedance of the tunable matching network 502. The control bus 607 can be implemented with a two-wire serial bus technology such as a Serial Peripheral Interface (SPI) bus (referred to herein as SPI bus 307). With an SPI bus 607, the controller 406 can transmit serialized digital signals to configure each DAC in FIG. 6. The control circuit 602 of FIG. 6 can utilize digital state machine logic to implement the SPI bus 607, which can direct digital signals supplied by the controller 406 to the DACs to control the analog output of each DAC, which is then amplified by buffers 608. In one embodiment, the control circuit 602 can be a stand-alone component coupled to the tunable reactive element 610. In another embodiment, the control circuit 602 can be integrated in whole or in part with another device such as the controller 406.

Although the tunable reactive element 610 is shown in a unidirectional fashion with an RF input and RF output, the RF signal direction is illustrative and can be interchanged. Additionally, either port of the tunable reactive element 610 can be connected to a feed point of the antenna 506, a structural element of the antenna 506 in an on-antenna configuration, or between antennas for compensating mutual coupling when diversity antennas are used, or when antennas of differing wireless access technologies are physically in close proximity to each other and thereby are susceptible to mutual coupling. The tunable reactive element 610 can also be connected to other circuit components of a transmitter or a receiver section such as filters, amplifiers, and so on, to control operations thereof.

Figure 8:
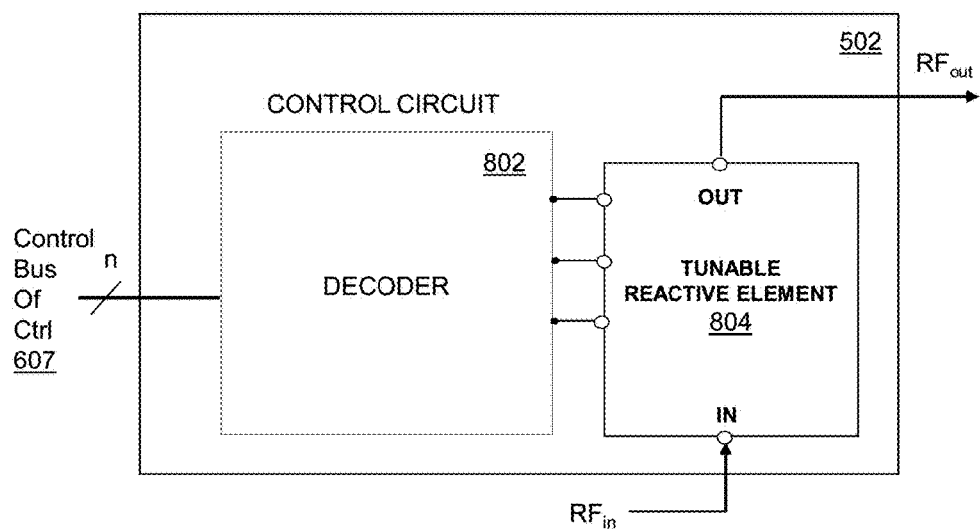
FIG. 8 depicts an illustrative embodiment of a tunable matching network of the transceiver of FIG. 5.
Figure 9:
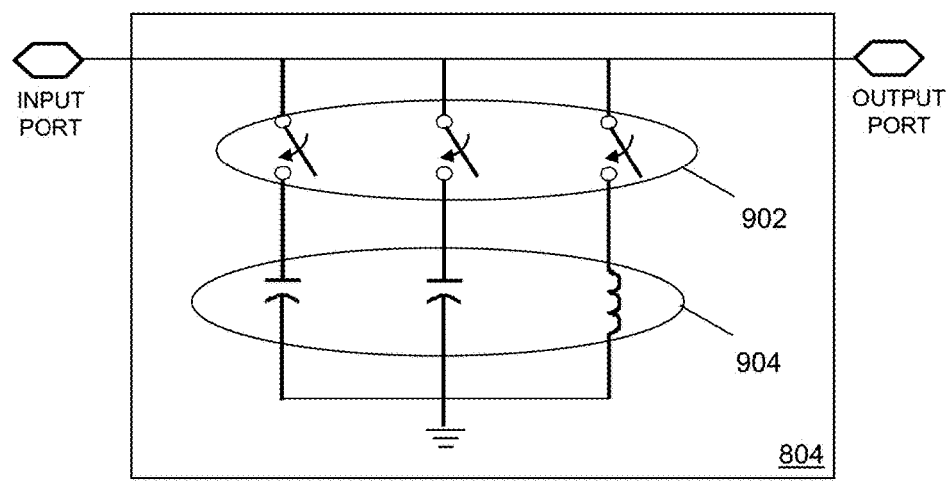
FIG. 9 depicts an illustrative embodiments of a tunable reactive element of the tunable matching network of FIG. 8.

In another embodiment, the tunable matching network 502 of FIG. 5 can comprise a control circuit 502 in the form of a decoder 802 and a tunable reactive element 804 comprising switchable reactive elements such as shown in FIGS. 8 and 9. In this embodiment, the controller 406 can supply the control circuit 802 signals via the SPI bus 607, which can be decoded with Boolean or state machine logic to individually enable or disable the switching elements 902. The switching elements 902 can be implemented with semiconductor switches, MEMS, or other suitable switching technology. By independently enabling and disabling the reactive elements 904 (capacitor or inductor) of FIG. 9 with the switching elements 902, the collective reactive impedance of the tunable reactive element 804 can be varied by the controller 406.

The tunable reactive elements 610 and 804 of FIGS. 6 and 8, respectively, can be used with various circuit components of the transceiver 402 to enable the controller 406 to manage performance factors such as, for example, but not limited to, transmit power, transmitter efficiency, receiver sensitivity, power consumption of the communication device 400, frequency band selectivity by adjusting filter passbands, linearity and efficiency of power amplifiers, SAR requirements, among other operational parameters.

As described herein, mechanisms are provided to facilitate a one chip (e.g., silicon chip) RF hardware design to support multiple frequency bands (e.g., short-range ISM RF in 433 MHz and 868/916 MHz bands). The multiple frequency bands can be supported by using dynamically tunable RF components (e.g., to dynamically change impedance). The dynamically tunable RF components can be, for example, tunable capacitors. In addition, the tunable RF components can be located in a low pass filter.

As described herein, various embodiments can be implemented in connection with detection of vehicle door open/closed condition, tire pressure, cargo/load detection, etc. In another example, the mechanism can operate in connection with a 2.4 GHz band and/or 5.8 GHz band. Various embodiments can operate in connection with wireless LAN (local area network) and/or a wireless WAN (wide area network). In various embodiments, the tunable components can be switched capacitor/inductor (C/L) banks. In various embodiments, the variable reactive element(s) can be used for impedance matching (e.g., to change impedance dynamically for a particular frequency (or frequency band)). In various embodiments, the variable reactive element(s) can be used for signal attenuation (e.g., to attenuate a signal to meet a particular regulatory (e.g., FCC or EU) requirement; to attenuate unwanted out of band frequencies (such as harmonics)).

As described herein, in various embodiments, one or more baluns can be provided that have minimal amplitude and phase mismatch.

As described herein, in various embodiments, a first LPF pass value can be provided to meet a first passband/out of band requirement associated with a first frequency (or frequency band) and a second (different) LPF pass value can be provided to meet a second passband/out of band requirement associated with a second frequency (or frequency band).

As described herein, various embodiments can provide a mechanism that operates in the context of a short-range IC (e.g., short-range SubGHz IC) that incorporates a differential output with combined Tx and Rx functions. In various embodiments, both such Tx and Rx can be optimized simultaneously (or substantially simultaneously).

As described herein, various embodiments can provide a mechanism that operates in the context of a transceiver using a power amplifier (PA) having a class AB style amplifier. Such an AB style amplifier can have variable output impedance depending on the power level implemented (e.g., for some transceiver output stages, the impedance (Rload_se and Rload_diff) is dependent on the output power). In various embodiments, dynamic impedance matching can be provided with respect to the amplifier variable output impedance to be optimized. In one or more embodiments, tuning can be done based on power level for PA's that are sensitive.

As described herein, various embodiments can be used in the context of any desired frequency or frequency band (e.g., any desired frequency or frequency band that utilizes an antenna of a given size/volume).

As described herein, various embodiments can provide tunable RF components in the balun and/or LPF circuits. The tunable components can be tuned by, for example, a controller (e.g., a microcontroller unit (or MCU)) depending on the frequency, power, and/or Tx/Rx mode being used. This allows multiple bands to be supported simultaneously (or substantially simultaneously). In various examples, one or more of the following items can be tuned to support this approach: (1) one or more baluns can be tuned to different bands; this can allow for different impedance transformations (e.g., 50:50, 50:100, 50:150:50, 200, 50:125, etc.); (2) one or more low pass filters (e.g., Chebyshev, Butterworth, Elliptic, Bessel, Gaussian, etc.) can be tuned to different passbands and/or attenuations depending on the band (e.g., ISM band) used; (3) for transceiver topologies that share Tx and Rx paths (e.g., Tx/Rx tied together) and have varying R_load_diff impedance based on power (e.g., Class AB amplifier) the impedance match(es) can be changed depending on power and/or frequency (typically, the Rx signal path is high Z—various embodiments allow for the impedance(s) to be optimized for power level depending on range of operation required; impedance(s) also can be optimized depending on region of use (e.g., EU and North America having different spurious regulatory requirements); (4) allow addition of external capacitor to tune the Ctune capacitor, such as, for example, adjustable from 2-7 pF; this can be dependent on board parasitics; typically, Ctune can be integrated in the transceiver IC, but in the configuration as described herein, more flexibility can be provided; (5) where the Tx and Rx paths share the same path, different Tx and Rx matches can be optimized/tuned dynamically via the capacitors based on whether Tx or Rx is in operation. The Ctune capacitor described above can be used to offset any on PC Board (PCB) parasitics that would differ depending on the frequency of operation. The Ctune capacitor is typically subject to a one-time change on startup via a register setting on the transceiver IC.

As described herein, one benefit of the disclosed configuration can be elimination of an extra switch (Differential or Single ended) and dynamic tuning of the matching for a particular ISM band (e.g., 433 MHz/915 MHz) or 2.4 GHz.

As described herein, one or more tunable components (e.g., BST capacitors and/or switched bank C/L) can be placed in the short-range RF circuit to tune to the appropriate band of operation. The single ended to differential balun, and harmonic LPF, can all be tuned depending on the frequency and power requirements. In one specific example, this can be implemented via use of one or more high voltage digital to analog converters (HVDAC) and one or more BST tuning capacitors. In one specific configuration, a HVDAC that is already used for a cellular modem main and diversity antenna tuning can be used for the capacitor tuning (hence saving the cost of adding a new HVDAC component). That is, use of a HVDAC that has available outputs can permit reuse of the HVDAC, thus saving cost.

In another example, the disclosed configuration can be applied to a 2.4 GHz BLE path. In another example, the disclosed configuration can be applied on a WiFI 2.4 GHz and/or 5.8 GHz chipset solution. In other examples, other frequencies can be used.

As described herein, various embodiments can be applied to TPMS sensors using 433 MHz, as well as to cargo, load detection and other sensors using the higher frequency ISM bands (e.g., 868 EU, 916 NA).

In one or more embodiments, support can be provided by the variable reactive element(s) for one or more frequencies anywhere in the ISM band range. In one specific example, support can be provided by the variable reactive element(s) for any frequency/channel in the range of 902 MHz to 928 MHz (inclusive).

As described herein, two or more frequency bands can be location specific, such as based on different countries, continents, etc.

In one or more embodiments, the tunable capacitors can be various types of dielectric which may or may not be BST. In one or more embodiments, the dielectric used in the tunable capacitor can be different dielectrics including BST in combination with a non-BST dielectric, doped and undoped BST, two different non-BST dielectrics, and so forth. Various types of voltage tunable dielectrics and capacitors are described in U.S. application Ser. No. 15/791,177, filed on Oct. 23, 2017, the disclosure of which is hereby incorporated by reference. In addition, the disclosure of U.S. Patent Application Publication No. 2018/0027560 (published on Jan. 25, 2018, U.S. application Ser. No. 15/218,798, filed on Jul. 25, 2016) is hereby incorporated by reference.

As described herein, in one example, a reactance of a variable reactive element can be dynamically changed during operation of a transceiver or radio (without either the transceiver/radio or the variable reactive element being cycled on/off or off/on during the operation) such that: at a first time the variable reactive element is controlled to have a first reactance appropriate for use with a first frequency (or first frequency band); then at a later time the variable reactive element is controlled to have a second (different) reactance appropriate for use with a second (different) frequency (or second frequency band); and then at a still later time the variable reactive element is again controlled to have the first reactance appropriate for use with the first frequency (or first frequency band).

As described herein, in another example, a reactance of a variable reactive element can be dynamically changed during operation of a transceiver or radio (without either the transceiver/radio or the variable reactive element being cycled on/off or off/on during the operation) such that: at a first time the variable reactive element is controlled to have a first reactance appropriate for use with a first frequency (or first frequency band); then at a later time the variable reactive element is controlled to have a second (different) reactance appropriate for use with a second (different) frequency (or second frequency band); and then at a still later time the variable reactive element is controlled to have a third (different) reactance appropriate for use with a third (different) frequency (or third frequency band).

Figure 10:
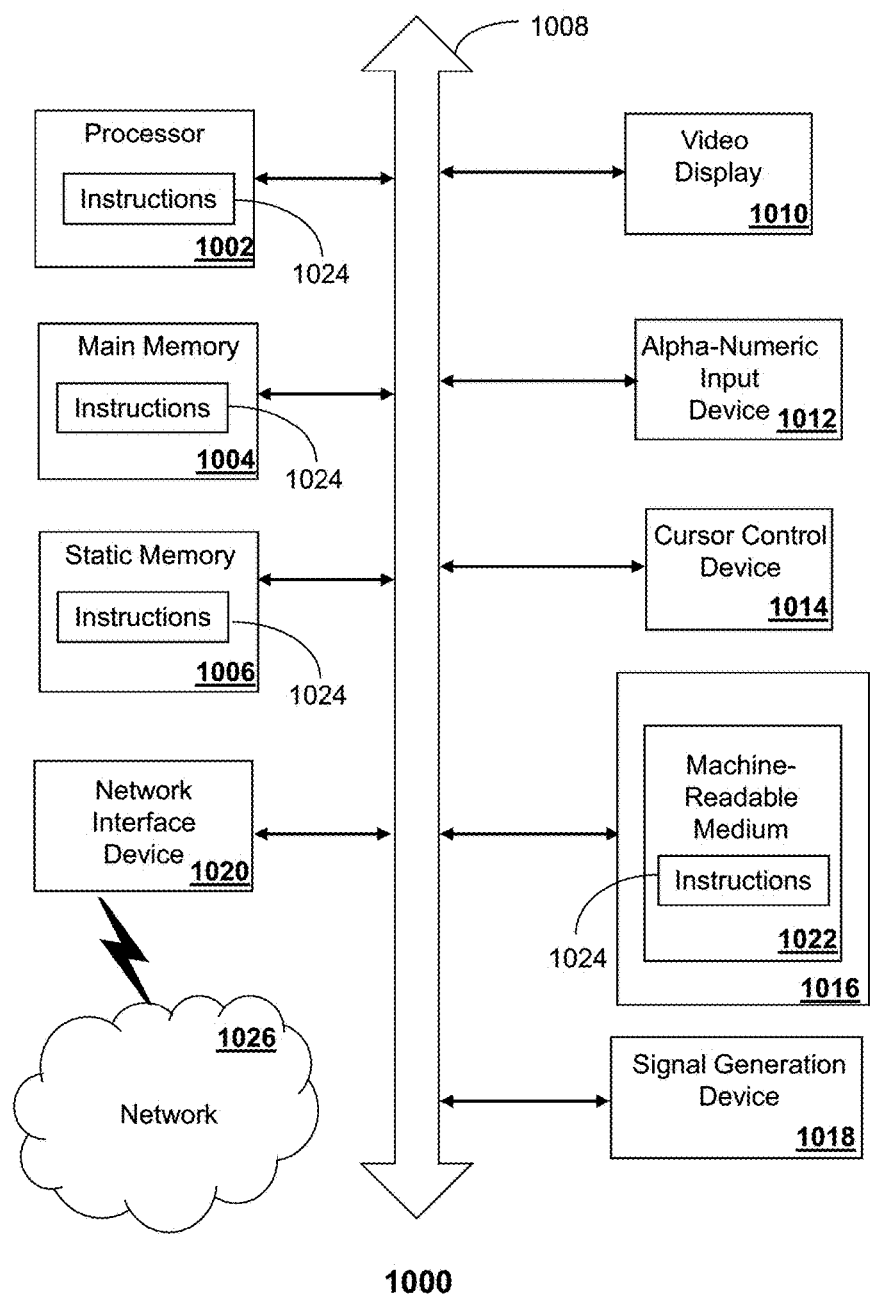
FIG. 10 depicts an illustrative diagrammatic representation of a machine in the form of a computer system within which a set of instructions, when executed, may cause the machine to perform any one or more of the methodologies disclosed herein.

Referring now to FIG. 10, this FIG. depicts an example diagrammatic representation of a machine in the form of a computer system 1000 within which a set of instructions, when executed, may cause the machine to perform any one or more of the methods discussed above. In some embodiments, the machine may be connected (e.g., using a network 1026) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1000 may include a processor (or controller) 1002 (e.g., a central processing unit (CPU), a graphics processing unit (GPU, or both), a main memory 1004 and a static memory 1006, which communicate with each other via a bus 1008. The computer system 1000 may further include a display unit 1010 (e.g., a liquid crystal display (LCD), a flat panel, or a solid state display. The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020. In distributed environments, the embodiments described in the subject disclosure can be adapted to utilize multiple display units 1010 controlled by two or more computer systems 1000. In this configuration, presentations described by the subject disclosure may in part be shown in a first of the display units 1010, while the remaining portion is presented in a second of the display units 1010.

The disk drive unit 1016 may include a tangible computer-readable storage medium 1022 on which is stored one or more sets of instructions (e.g., software 1024) embodying any one or more of the methods or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1000.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Upon reviewing the aforementioned embodiments, it would be evident to an artisan with ordinary skill in the art that said embodiments can be modified, reduced, or enhanced without departing from the scope of the claims described below Other embodiments can be applied to the subject disclosure without departing from the scope of the claims described below.

It should be understood that devices described in the various embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device, comprising:
   a junction that facilitates receiving a signal from a transceiver, wherein the transceiver is implemented as an integrated circuit (IC) chip, wherein the signal is in a frequency band comprising a first sub-frequency band and a second sub-frequency band, and wherein the first sub-frequency band is below the second sub-frequency band;
   a variable reactive element coupled to the junction, wherein the variable reactive element receives from the junction a first portion of the signal in the first sub-frequency band and a second portion of the signal in the second sub-frequency band;
   a controller coupled to the variable reactive element, wherein the controller facilitates control of the variable reactive element for placing the variable reactive element into one of a group of states, wherein the group of states comprises a first state having a first reactance and a second state having a second reactance, and wherein the first reactance is different from the second reactance; and
   a low pass filter coupled to the variable reactive element, wherein the low pass filter receives from the variable reactive element the first portion of the signal in a first case that the variable reactive element is placed into the first state, wherein the low pass filter receives from the variable reactive element the second portion of the signal in a second case that the variable reactive element is placed into the second state, wherein in the first case the low pass filter outputs a first part of the first portion of the signal that is below a first frequency cutoff, wherein in the second case the low pass filter outputs a second part of the second portion of the signal that is below a second frequency cutoff, and wherein the first frequency cutoff is below the second frequency cutoff.

2. The device of claim 1, wherein the low pass filter is tunable and wherein the controller is coupled to the low pass filter to control tuning of the low pass filter.

3. The device of claim 2, wherein the low pass filter is set to have the first frequency cutoff in the first case that the variable reactive element is placed into the first state, and wherein the low pass filter is set to have the second frequency cutoff in the second case that the variable reactive element is placed into the second state.

4. The device of claim 1, wherein the low pass filter comprises a tunable capacitor.

5. The device of claim 1, wherein the low pass filter comprises a plurality of capacitors.

6. The device of claim 1, wherein the low pass filter comprises an LC balun.

7. The device of claim 1, wherein each of the first reactance and the second reactance comprises one of a capacitance, an inductance, or a combination thereof.

8. The device of claim 1, wherein the variable reactive element comprises a tunable capacitor.

9. The device of claim 1, wherein the variable reactive element comprises an LC balun.

10. The device of claim 1, wherein the variable reactive element comprises a plurality of capacitors, wherein placement of the variable reactive element into the first state comprises selecting a first subset of the plurality of capacitors to provide the first reactance, wherein placement of the variable reactive element into the second state comprises selecting a second subset of the plurality of capacitors to provide the second reactance, and wherein the first subset is different from the second subset.

11. The device of claim 1, wherein the junction comprises a plurality of connection points, wherein the first sub-frequency band comprises 433 MHz, and wherein the second sub-frequency band comprises a range including 868 MHz to 916 MHz.

12. The device of claim 1, wherein the first reactance of the first state comprises a first range of reactances, wherein the second reactance of the second state comprises a second range of reactances, and wherein the first range of reactances is distinct from the second range of reactances.

13. The device of claim 1, wherein the controller comprises a microprocessor.

14. A circuit, comprising:
   a connection that facilitates receiving a signal from a radio that is implemented as an integrated circuit (IC) chip, wherein the signal is in a frequency band comprising a first sub-frequency band and a second sub-frequency band, and wherein the first sub-frequency band is below the second sub-frequency band;
   a variable reactive element that receives the signal from the connection, wherein a first part of the signal is in the first sub-frequency band and a second part of the signal is in the second sub-frequency band;

a controller in operative communication with the variable reactive element, wherein the controller facilitates control of the variable reactive element for placing the variable reactive element into one of a group of states, wherein the group of states comprises a first state having a first reactance value and a second state having a second reactance value, and wherein the first reactance value is different from the second reactance value; and a low pass filter;

wherein the low pass filter is in operative communication with the variable reactive element;

wherein the low pass filter receives from the variable reactive element the first part of the signal in a first case that a reactance of the variable reactive element is the first reactance value;

wherein the low pass filter receives from the variable reactive element the second part of the signal in a second case that the reactance of the variable reactive element is the second reactance value;

wherein, in the first case, the low pass filter outputs a first portion of the signal that is below a first threshold;

wherein, in the second case, the low pass filter outputs a second portion of the signal that is below a second threshold; and wherein the first threshold is below the second threshold.

15. The circuit of claim 14, wherein:
the variable reactive element comprises a barium strontium titanate (BST) tunable capacitor.

16. The circuit of claim 14, wherein the controller comprises a microprocessor.

17. A method, comprising:
receiving from a transceiver that is implemented as an integrated circuit (IC) chip, by a variable reactive element, a signal, wherein the signal is in a frequency band that comprises a first sub-frequency band and a second sub-frequency band, and wherein the first sub-frequency band is below the second sub-frequency band;

controlling, by a controller in operative communication with the variable reactive element, the variable reactive element, wherein the controller controls the variable reactive element by placing the variable reactive element into one of a group of states, wherein the group of states comprises a first state having a first reactance and a second state having a second reactance, and wherein the first reactance is different from the second reactance; and low pass filtering, by a low pass filter in operative communication with the variable reactive element, an output from the variable reactive element, wherein the low pass filter filters a first portion of the signal in a first case that the variable reactive element is placed into the first state, wherein the low pass filter filters a second portion of the signal in a second case that the variable reactive element is placed into the second state, wherein in the first case the low pass filter outputs a first part of the first portion of the signal that is below a first threshold, wherein in the second case the low pass filter outputs a second part of the second portion of the signal that is below a second threshold, and wherein the first threshold is below the second threshold.

18. The method of claim 17, wherein the controller comprises a microprocessor, wherein the controller is in operative communication with the low pass filter, and wherein the controller controls the low pass filter such that the low pass filter is set to have the first threshold or the second threshold.

19. The method of claim 17, further comprising transmitting a transmitted signal in accordance with one of the first part of the first portion of the signal that is below the first threshold or the second part of the second portion of the signal that is below the second threshold.

20. The method of claim 19, wherein the transmitting comprises transmitting data related to one of a tire pressure sensor measurement, a door open/closed sensor measurement, a load detection measurement, or a combination thereof.

* * * * *